(12) United States Patent
Carroll et al.

(10) Patent No.: US 11,948,786 B2
(45) Date of Patent: Apr. 2, 2024

(54) MICROCHANNEL PLATE AND METHOD OF MAKING THE MICROCHANNEL PLATE WITH METAL CONTACTS SELECTIVELY FORMED ON ONE SIDE OF CHANNEL OPENINGS

(71) Applicant: Elbit Systems of America, LLC, Fort Worth, TX (US)

(72) Inventors: Stephen Carroll, Salem, VA (US); William J. Baney, Roanoke, VA (US); Cooper Gray Temple, Christiansburg, VA (US); Matthew Robert Curtis, Blue Ridge, VA (US)

(73) Assignee: Elbit Systems of America, LLC, Fort Worth, TX (US)

( * ) Notice: Subject to any disclaimer, the term of this patent is extended or adjusted under 35 U.S.C. 154(b) by 30 days.

(21) Appl. No.: 17/752,151

(22) Filed: May 24, 2022

(65) Prior Publication Data
US 2023/0386810 A1    Nov. 30, 2023

(51) Int. Cl.
*H01J 43/28* (2006.01)
*C03C 15/00* (2006.01)
(Continued)

(52) U.S. Cl.
CPC .............. *H01J 43/28* (2013.01); *C03C 15/00* (2013.01); *C23C 14/042* (2013.01); *C23C 14/14* (2013.01); *C23C 14/225* (2013.01); *C23C 14/24* (2013.01); *C23C 14/505* (2013.01); *H01J 43/02* (2013.01); *H01J 43/12* (2013.01)

(58) Field of Classification Search
CPC ........ H01J 31/50; H01J 40/506; H01J 40/507; H01J 43/04; H01J 43/06; H01J 43/08; H01J 43/12; H01J 43/10; H01J 43/24; H01J 43/243; H01J 43/246; H01J 43/02; H01J 43/28; C23C 14/505; C23C 14/24;
(Continued)

(56) References Cited

U.S. PATENT DOCUMENTS 3,902,240 A * 9/1975 Chang ................... H01J 43/246
445/47
4,945,286 A * 7/1990 Phillips ................. H01J 29/023
427/126.6
(Continued)

OTHER PUBLICATIONS

European Search Report issued to related EP Application No. 23174602.5, dated Oct. 5, 2023, 11 pages.

*Primary Examiner* — John R Lee
(74) *Attorney, Agent, or Firm* — K&L Gates LLP (57) ABSTRACT

A night vision system, a microchannel plate (MCP), and a planetary deposition system and methodology are provided for selectively depositing an electrode contact metal on one side of MCP channel openings. One or more MCPs can be releasably secured to a face of a platter that rotates about its central platter axis. The rotating platter can be tilted on a rotating ring fixture surrounding an evaporative source of contact metal. Therefore, the rotating platter further rotates so that it orbits around the evaporative source of contact metal. A mask with a variable size mask opening is arranged between the rotating platter and the evaporative source. While the mask orbits around the evaporative source with the rotating platter, the mask does not rotate along its own axis as does the rotating platter.

7 Claims, 7 Drawing Sheets

(51) Int. Cl.
  *C23C 14/04* (2006.01)
  *C23C 14/14* (2006.01)
  *C23C 14/22* (2006.01)
  *C23C 14/24* (2006.01)
  *C23C 14/50* (2006.01)
  *G02B 23/12* (2006.01)
  *H01J 43/02* (2006.01)
  *H01J 43/12* (2006.01)

(58) Field of Classification Search
  CPC ..... C23C 14/225; C23C 14/14; C23C 14/046; C23C 14/042; C03C 15/00
  See application file for complete search history.

(56) References Cited

U.S. PATENT DOCUMENTS

| | | | |
|---|---|---|---|
| 5,268,612 A * | 12/1993 | Aebi | H01J 31/506 313/105 CM |
| 5,493,169 A * | 2/1996 | Pierle | H01J 31/507 313/105 CM |
| 5,776,538 A * | 7/1998 | Pierle | H01J 31/507 427/78 |
| 6,215,232 B1 * | 4/2001 | Johnson | H01J 43/246 313/105 CM |
| 6,271,511 B1 | 8/2001 | Pierle | |
| 6,876,802 B2 * | 4/2005 | Rosine | G02B 6/08 313/103 R |
| 6,917,144 B2 * | 7/2005 | Batista | H01J 9/12 313/104 |
| 9,177,764 B1 * | 11/2015 | Baney | H01J 9/14 |
| 10,685,806 B2 * | 6/2020 | Styonavich | H01J 29/023 |
| 2004/0032193 A1 * | 2/2004 | Batista | H01J 43/246 313/123 |
| 2013/0306867 A1 * | 11/2013 | Uchiyama | H01J 43/246 250/361 R |
| 2023/0152473 A1 * | 5/2023 | Blick | G03F 7/0037 250/336.1 |

\* cited by examiner

MICROCHANNEL PLATE AND METHOD OF MAKING THE MICROCHANNEL PLATE WITH METAL CONTACTS SELECTIVELY FORMED ON ONE SIDE OF CHANNEL OPENINGS

FIELD OF THE INVENTION

Example embodiments in general relate to night vision systems and, more particularly, image intensifier tubes and a method of manufacturing an improved microchannel plate (MCP) of an image intensifier tube using a masked planetary evaporative deposition system. The MCP is configured with channel openings having metal contacts extending a predefined distance into the channel openings on only one side of the channel openings to increase the open area ratio (OAR), first strike efficiency (FSE), secondary electron amplification, and overall signal to noise ratio (SNR) of the MCP.

BACKGROUND

Night vision system such as night vision goggles typically include an image intensifier tube. The image intensifier tube, or "image intensifier", can include an electron multiplier arranged between a photocathode and a sensor anode. The photocathode detects light in the form of photons sent through a lens from an object. The image intensifier tube includes an electron multiplier, such as a MCP, that amplifies or multiplies the resulting photoelectrons, or "electrons", emitted from the photocathode. The multiplied electrons can be drawn to the anode, where they can be converted back to photons displayed on a screen. The anode or screen can include a sensor that, upon receiving the increased or multiplied number of electrons, senses those electrons and produces an intensified representation of the image on the screen. The photocathode, the electron multiplier, and the anode are typically supported in a vacuum housing with gaps between the photocathode, electron multiplier, and the sensor anode to provide gain and facilitate the flow of electrons therebetween. The night vision system can further include one or more eyepieces arranged on night vision system, or goggles, between the screen and the user's eyes.

One type of electron multiplier is a MCP. The MCP is placed between the photocathode and a phosphor-covered sensor anode. The photocathode produces a pattern of electrons that correspond with the pattern of photons produced from a low-light level image. Through use of electrostatic fields, the pattern of photoelectrons emitted from the photocathode are directed to the surface of the MCP. The MCP input surface is substantially planar with openings spaced across the input surface, and each opening extends as micro channels or "channels" that extend from the input surface to an opposed output surface substantially parallel to the input surface. As the incoming electrons strike the inner surface of the channel opening, secondary electrons are produced. Accordingly, the MCP emits from its micro channels a proportional number of secondary emission electrons dependent on the primary electrons sent from the photocathode. The secondary emission electrons thereby form an electron shower to amplify the electrons produced by the photocathode in response to the initial low-light level image. The shower of electrons, at an intensity much above that produced by the photocathode, are then directed onto a phosphorescent screen of a phosphor-covered anode. The phosphor layer on the screen produces an image of visible light which replicates the low-light level image as presented on the eyepiece of the night vision system.

The MCP can be formed from a bundle of very small cylindrical tubes, or glass fibers, which have been fused together into a parallel orientation. The bundle can then be sliced to form the MCP. The glass fibers of the bundle thus have their lengths arranged generally along the thickness of the MCP. An MCP may therefor contain an extremely large number of hollow tubes, or micro channels, between the input and output faces of the MCP. Each channel can form the electron passageway between the input and output faces of the MCP.

In many instances, each tube is slightly angulated with respect to the normal of the MCP planar input and output faces. For example, the central axis of each channel can be biased at a channel bias angle (CBA) relative to the normal of the MCP input and output planar surfaces, and the CBA is typically between 5° to 16° from normal. The CBA ensures that electrons which enter the channel normal to the MCP input face will strike a channel wall (or arcuate side surface) and also helps keep positive ions generated during the operation of the image intensifier from traveling to the photocathode where they can cause damage. The physical properties of the channel walls or arcuate sides that surround a central axis of the channel are such that, generally, a plurality of electrons are emitted each time the sides are contacted by one energetic electron. The material of the channel side surfaces that curve around the central axis of the channel have a high coefficient of secondary electron emission for producing electron-emissivity greater than one.

At the input and output faces of the MCP is a contiguous metal contact. An input metal contact on the input face of the MCP is preferably biased to a different voltage than the output metal contact on the output face of the MCP. The contact metal applied to the input surface face is often referred to as an input electrode, whereas the contact metal applied across the output surface face is often referred to as an output electrode. The input and output electrodes are voltage biased to produce an electric field through each channel. The electric field draws the secondary electrons produced at input channel openings through the MCP and toward the anode. The electrostatic field across each channel causes the secondary electrons to continue to increase, or cascade, along the length of each channel and the cascaded electrons exit the individual channels of the MCP under the influence of another electrostatic field to further accelerate the multiplied electrons onto a phosphor-covered screen anode. The number of electrons emitted from the channel will average with those emitted from the other channels to produce an overall amplification or gain of the MCP.

One inherent problem of MCPs is that a photoelectron released from the photocathode may not fall into one of the slightly angulated channels, but instead can impact the area of the input face region between the channel openings. That area between channel openings comprise the contact metal on the input face of the MCP causing some electrons impinging on that area to produce unwanted scattering or bouncing of electrons therefrom. This can cause image fidelity loss, but more germane is that many of these electrons are absorbed and lost from participating in the amplification process, and thus reduces the overall SNR of the MCP. The electrons that strike the MCP from the photocathode are referred to as "primary electrons." The primary electrons are those electrons or photoelectrons that strike the MCP for the very first time. The primary electrons, once they strike the MCP and specifically the walls or sides of the channel openings near the input face of the MCP create a group of secondary electrons referred to as "first strike electrons." The primary electrons that enter a channel and strike the channel wall will therefore eject secondary electrons from the impact. The number of secondary electrons generated by the impact of a primary electron is referred to as the "first strike efficiency".

In the example above, the primary electrons that scatter from the area between channel openings can enter alternate channels not aligned with the proper location of their photocathode origin. The first strike electrons created from the area between openings may bounce or scatter under bias to another channel nearby, causing a halo effect at the output of the MCP. The scattered first strike electrons sent to a nearby channel opening will also decrease the overall image fidelity by visually distorting the image produced by the image intensifier. In other instances, the errant electron is simply absorbed by the contact metal on the input face of the MCP between openings and is not amplified to produce part of the image or signal produced by the detector anode, decreasing SNR.

One solution to this problem is to increase the amount of channel diameter. Using an etching barrier around each channel, each channel diameter can by increased thereby improving the ratio of total open area of the channels to the area between channel openings. This technique allows the MCP to be produced with a theoretical OAR exceeding 65%. However, while increasing the OAR increases the probability that electrons will enter a channel to improve the SNR image intensification, the relatively thin remaining cladding between channel openings lessens the overall structural integrity of the MCP.

In addition to conventional MCPs having theoretical restrictions in OAR and SNR, the contact metal on the input face of the MCP can also negatively impact SNR and gain. If the primary electron strikes contact metal typically extending into the input side opening of the channel, secondary electrons can be suppressed and first strike electrons will not be generated. A typical side of a channel opening that does not contain contact metal on that side has an electron emissivity coefficient greater than one. However, since contact metal on the input face of the MCP can also extend into the input side channel opening, primary electrons can strike that contact metal having an electron emissivity much less than one. Typically, contact metal can have an electron emissivity of about 0.8, causing about 20% of the electrons that hit the contact metal at the input side channel opening inner wall to be immediately lost to the much higher electron emissivity coefficient within the channel not containing a contact metal coating.

SUMMARY

The problems outlined above are in large part solved by an improved night vision system having an image intensifier tube and a MCP, and a method of manufacturing the same. An improvement in forming the channel opening to increase OAR greater than 80% is possible without negatively impacting the structural integrity and manufacturing yield of the MCP. An improvement in MCP channel opening also takes place by selectively forming contact metal on each opening to maintain appropriate electrostatic fields through each channel while also increasing the first strike electrons generated from the primary electron strikes. Each channel can be biased at a CBA relative to the input and output surfaces of the MCP. Also, the opening of each channel can be tapered. That tapered sidewall surface of each channel opening defines an entry portion that receives a large proportion of the primary electrons due to the enlarged tapered opening with minimal area between openings at the input face. The opposite, output face of the MCP at the channel openings also contains a contact metal coating coupled to a voltage supply in order to produce the electrostatic field from the input side tapered channel openings through the channel to the output side. The contact metal is thereby selectively applied only on one side of the input channel opening partially into the channel a distance typically not exceeding ¾ the channel diameter (D), where D can be measured at the surface of the MCP or, if tapered, is measured past the tapered portion of the channel.

By biasing each channel at a CBA relative to the normal of the planar surface of the MCP input face, and also tapering that channel opening at the input face, more surface is available for receiving the primary electron. An increase in OAR is therefore available, and the SNR and gain of the MCP is also increased. By arranging the contact metal on a "shaded" side of the channel opening opposite the primary electron strike side, or "showered" side, of the channel opening at the input face, a greater number of first strike electrons can be produced. This is the result of the channel opening being biased so the primary electrons contact essentially the showered side and not the shaded side of the channel opening. Tapering the channel opening to produce a funnel shaped channel opening at the input face surface of the MCP, along with placing contact metal only in the shaded area of each channel opening, allows the primary electrons and first strike electrons to not be absorbed. An improved performance of the MCP yields an improved image intensifier tube within a night vision system.

An important feature of combining a funnel shaped channel opening with contact metal on only a select shaded side of that opening is so that, as the contact metal is deposited, more surface area is available on one side of the channel opening by virtue of the tapered opening and angle of deposition from the opposite side. The combination of the improved funnel shape and select metallization depth into the channel and select metallization circumferentially around only the shaded arcuate side imparts a primary benefit of being able to optimize contact metal placement for improved MCP performance. The metallization used to produce the contact metal on the input face of the MCP can therefore be selectively placed at differential depths into, and at different circumferential distances around, only the shaded side of each of the plurality of channel openings.

In accordance with at least one example of the present disclosure, a night vision system is provided. The night vision system can include an image intensifier placed between a lens and an eyepiece. The image intensifier tube can include a photocathode and a phosphor covered anode. Between the photocathode and the anode is a MCP. The MCP is arranged a spaced distance between the photocathode and the phosphor covered anode, and comprises a spaced plurality of channel openings. The channel openings can be funnel shaped and face the photocathode at the MCP input face to receive incoming electrons from the photocathode. Contact metal is applied via a planetary deposition system on only a first side of the channel openings, and specifically on a shaded side of each of the plurality of parallel spaced channel openings.

The first side (or shaded side) of the channel openings at the face of the MCP is no more than one half a circumferential distance around each of the plurality of channel openings. A second side of each channel opening is radially opposite the first side and also preferably no more than one half a circumferential distance around each opening. The contact metal preferably draws first strike electrons produced from the second side (or showered side) of the channel openings. The first side can include contact metal selectively placed circumferentially around no more than one half the inner surface of the input side channel opening. The first and second sides therefore extend around the inner wall in an arcuate pattern, each being opposite from each other and an equal distance from a central axis of each channel. The first side containing contact metal can extend a selectable distance into each channel opening depending on the arrangement of the planetary deposition system.

In accordance with another example of the present disclosure, a system for depositing contact metal on a MCP is provided. The system includes an evaporative source of contact metal and a platter spaced from the evaporative source. The platter has a platter central axis extending perpendicular through the substantially planar opposing surfaces of the platter at the center of the platter. The platter is configured to retain a plurality of MCPs, and to rotate around its own platter central axis while maintained in a tilted position circling (or orbiting around) the evaporative source. A mask is arranged between the platter and the evaporative source. The mask comprises an adjustable mask opening to expose adjustably variable regions of the MCP-containing platter to the evaporative source. Importantly, the mask is stationary relative to the rotating platter, and thus the mask opening is also stationary relative to the rotating platter and the MCPs mounted thereon.

The MCPs, and specifically the channel openings of each MCP are mounted to the platter in a biased direction. The channel openings of each MCP are arranged so the CBA, and specifically a vector along the CBA extends from the channel openings along respective channel central axes toward the platter central axis. A planar surface of the platter on which the MCP is retained is tilted from a vertical axis. The platter can be tilted at a first angle φ1 relative to a first axis. According to one example, the first axis can be a vertical axis. The rotatable platter is held in the tilted position and is further configured to rotate around the evaporative source at a second angle φ2 relative to a second axis. According to one example, the second axis can be a horizontal axis.

According to another example, the channel opening can be a funnel shaped channel opening. The tapered first and second sides of the funnel shaped channel opening extend from the input face a first distance into the channel. A contact metal is configured to be electrically biased and extends along only the tapered first side approximately the first distance less than ¾ the diameter (D). Diameter (D) of the channel is measured further down the channel past the taper or funnel distance.

In accordance with yet another example of the present disclosure, a method is provided for selectively depositing contact metal into a channel of a MCP. The method includes securing the MCP onto the platter. The platter can then be rotated about its own platter central axis while tilting the platter relative to the evaporative source of contact metal. The rotating and tilted platter containing at least one MCP is rotated (or orbited) about the evaporative source while maintaining a mask between the MCP-secured, rotating and orbiting platter. The platter that rotates around its own platter central axis and also rotates or orbits around the evaporative source achieves a planetary deposition methodology. The mask is stationary relative to the rotating platter, and specifically an opening in the mask is stationary relative to the rotating platter to selectively expose channel openings of each MCP on the platter to the evaporative source.

According to another example, the channel central axis of each of the channels, when the corresponding MCPs are mounted on the platter, is arranged to extend at a channel bias angle along a vector that points toward the platter central axis. Mounting each MCP so the CBA of each channel opening faces toward the center of the platter allows the evaporative source, when activated, to deposit contact metal through the mask opening and onto only the first side of the channel openings. Tilting and rotating the platter relative to the evaporative source at varying varying first and second angles allows the planetary deposition system and method to deposit the contact metal at varying distances into the channel sidewall. Varying the mask opening from a wedge shape to a semi-circular shape allows the planetary deposition system and method to deposit the contact metal at varying circumferential distances around the channel sidewall and specifically at varying circumferential distances around the first, or shaded, side.

According to another example, the method further provides for forming a funnel shaped channel opening for each of the channel openings before securing the MCP to the platter. The glass cores are formed by surrounded each with respective glass cladding. The glass cladding can then be etched at the boundary between the glass cores and the surrounding glass cladding to a first distance into the plate. The glass cores can then be etched and then removed entirely from the remaining glass cladding to form the funnel shaped plurality of spaced channels. Contact metal is then formed along only a first side of the funnel shaped plurality of spaced channels radially around no more than one half each of the plurality of spaced channels. The contact metal on the first side is formed in an arcuate pattern around a central axis of each channel downward into each channel along the tapered funnel shaped opening but preferably less than one-half distance around the central axis of each spaced channel. Each spaced channel is parallel to one another at a CBA relative to a normal at which the primary electrons arrive from the photocathode onto the MCP input face. Importantly, because of the CBA, and because the opening can be funnel shaped and tapered with greater sized contact metal on the shaded first side of the channel openings, the second side of the tapered channel openings, or showered side, produces greater first strike electrons to increase the overall MCP performance.

BRIEF DESCRIPTION OF THE DRAWINGS

Examples of the present disclosure are best understood from the following detailed description when read in connection with the accompanying drawings. According to common practice, the various features of the drawings are not drawn to scale, or are only shown in partial perspective. The dimension of the various embodiments are shown arbitrarily expanded or reduced for clarity. Like numerals are used to represent like elements among the drawings. Included in the drawings are the following features and elements, and reference will now be made to each drawing in which.

DETAILED DESCRIPTION OF EXAMPLE EMBODIMENTS

The following discussion is directed to various example embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

As noted above, the drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection of the two devices, or through an indirect connection that is established via other devices, components, nodes, and connections. In addition, as used herein, the terms "axial" and "axially" generally mean along or parallel to a given axis (e.g., x, y or z direction or central axis of a body, opening, channel, outlet or port), while the terms "radial" and "radially" generally mean perpendicular to the given axis. For instance, an axial distance refers to a distance measured along a central axis, and a radial distance means a distance measured perpendicular to the central axis. Radially opposite can mean on opposite sides of the central axis and in an arcuate pattern only partially around and spaced an axial distance from the central axis.

Figure 1:
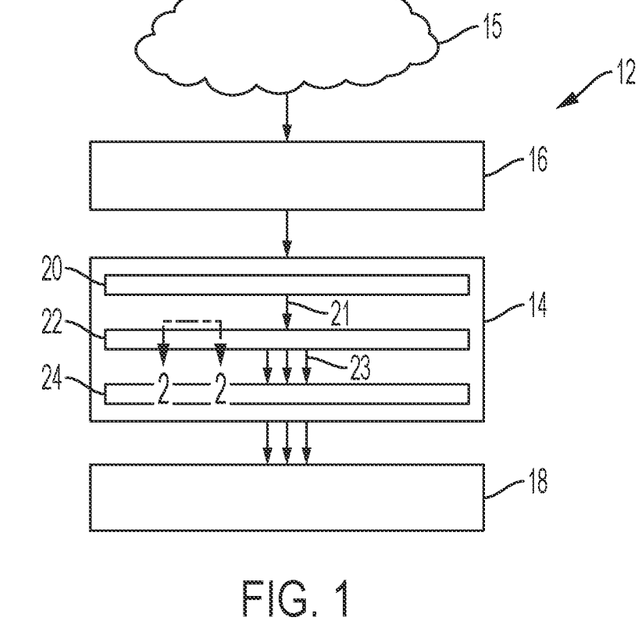
FIG. 1 is a partial block diagram of a night vision system utilizing an image intensifier tube having a MCP.

Referring now to FIG. 1, a partial block diagram of a night vision system 12 is shown. Night vision system 12 comprises an image intensifier tube 14 placed between a pair of lenses 16 and 18. Lens 16 can be a focusing lens that focuses photons from object 15 onto image intensifier 14. Lens 18 can be an eyepiece that directs the outgoing photons produced from image intensifier 14 onto a user's eye. The night vision system 12 can be, for example, goggles, where eyepiece 18 can include two eyepieces.

Image intensifier 14 can be a vacuum tube and is fairly well known, based on Generation-III (GaAs photocathode) or Generation-II (multi-alkali photocathode) image intensifier fiber. Within the image intensifier tube 14 is a photocathode 20. Photocathode 20 may comprise a faceplate made of glass and coated with GaAs on a backside surface of the faceplate. Other type III-V materials can be used such as GaP, GaIn, AsP, InAsP, InGaAs, etc. Alternatively, photocathode 20 may be known as Bi-alkali photocathode. Photoemissive semiconductor material of photocathode 20 absorbs photons arriving on a photon receiving face of image intensifier tube 14. Photons absorb by photocathode 20 cause the carrier density of the semiconductor material to increase, thereby causing the material to generate a photocurrent of electrons 21 emitted from the backside electron emission face of photocathode 20.

Photocathode 20, according to one example, converts non-visible or visible low light sources. The non-visible light sources can be near infrared or short wave infrared to visible. An electron multiplier 22 receives electrons 21, and multiplies those electrons to produce multiplied electrons 23. A popular electron multiplier includes a microchannel plate (MCP). MCP 22 is typically formed through a plurality of glass fibers, each having a core surrounded by an exterior glass cladding. Each of the plurality of cores can be removed, leaving a spaced plurality of microchannels, or "channels" from the input face to the output face of the MCP. The inside walls or sides of each channel opening has a high electron emissivity coefficient to produce a shower of secondary electrons. The channels are spaced from each other and extend from the input planar surface, or input face, to the output planar surface, or output face, where multiplied electrons are emitted. The secondary emission electrons amplify the electrons produced by the photocathode in response to initial low light level images. The shower of electrons are produced at an intensity greater than that produced by the photocathode, and therefore the MCP 22 has amplification and gain.

Voltage sources can be applied between the various elements of image intensifier 14 to draw electrons from photocathode 20 to MCP 22, through MCP 22, and from the backside emissions surface of MCP 22 onto anode 24. The voltage sources produce an electrostatic field that draws both primary and secondary electrons through image intensifier 14 to impart the desired energy to the multiplied electrons applied to the phosphor covered screen, or anode 24. The phosphor-covered screen converts the multiplied electron pattern initiated from photocathode 12 to a visible light image of the initially received low level image from target 15. The emitted photons are directed by optics, such as a fiber optic bundle of anode 24 from image intensifier 14 onto eyepiece 18. When viewing through eyepiece 18, a user can discern low level visible or non-visible photons reflected or generated from target image 15 through use of the amplified gain and electron multiplication of MCP 22.

Figure 2:
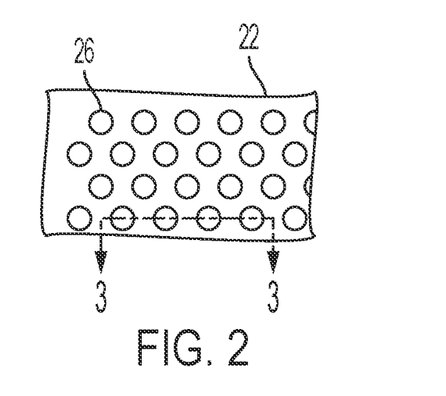
FIG. 2 is a partial top view of a MCP along section 2-2 of FIG. 1.

Turning now to FIG. 2, a top view, when viewed from photocathode 20 of MCP 22 is illustrated. Specifically, the top view along section 2-2 of FIG. 1 is illustrated. A plurality of channels extend entirely though MCP 22. Each channel 26 includes adjoining openings on the input and output sides of MCP 22. Since MCP 22 is shown in FIG. 2 from the photocathode side, the input side or input face is therefore the electron receiving side that receives primary electrons 21 from photocathode 20, as shown in FIG. 1. Each channel 26, along with the input and output openings thereof is preferably the same diameter among channels and openings. The channel 26 dimensions are therefore preferably consistent across MCP 22. The pitch or spacing between channels 26 should also be consistent. Due to flaws in composition, fabrication, etch and cleaning of the channel sides, some channels 26 may be larger in diameter than others, causing non-uniform multiplied electron emissions on the output face of MCP 22. Moreover, such flaws can create etch-through of the channel sides or walls, leading to points in the glass surface that become emission points. It is desirable that the ratio of opening area to the space between openings have an open area ratio (OAR) as high as possible. Conventional, non-funneled channels have an OAR less than 70% due to the need for retaining sufficient channel wall material between openings to maintain the overall structural strength required of an MCP.

Figure 3:
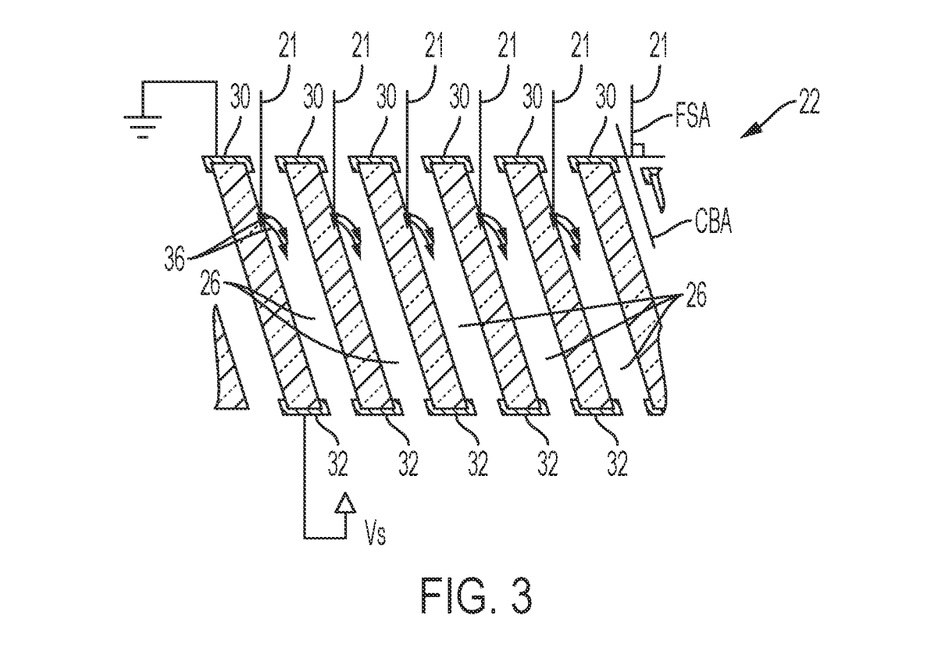
FIG. 3 is a partial cross sectional view along section 3-3 of FIG. 2, showing each channel central axis aligned at a CBA, and a first strike angle at which the primary electrons strike the showered first strike side of each channel wall near each channel opening.

Turning now to FIG. 3, a cross-sectional view of plane 3-3 of FIG. 2 is shown. FIG. 3 illustrates in more detail the plurality of channels 26 within the honeycomb structure of MCP 22. The channels provide a fairly reliable electron multiplier provided the channels 26 are properly slanted or biased at an optimal CBA. An electric field is created between the voltage source $V_s$ supplied to contact metal 30 applied across the input face and contact metal 32 applied continuously across the output face. The channels 26 are the openings that therefore exist between the input and output faces of MCP 22, which can be scrubbed to remove any remaining impurities which could inhibit secondary emissions or produce positive ion bombardment of the photocathode. The accelerating electrostatic fields through each channel 26 occur by applying contact metal on the input and output faces and biasing the contact metal with the voltage supply $V_s$, wherein the contact metal can include a good conductive material such as Inconel or Nichrome. A contact metal 30 and 32 can extend partially into the channel. The slant angle, or CBA, is taken along the central axis of the channels 26 and is substantially identical across each channel 26 since the channels are parallel to one another. The CBA can be between 5° and 16° relative to the normal of the MCP planar input face.

The electrons 21 sent from photocathode 20 (FIG. 1) strike a side of each channel 26 at a first strike angle (FSA). The electrons sent from photocathode 20 are herein referred to as primary electrons 21. Since secondary electrons are generated from the first strike of primary electrons 21, the secondary electrons resulting from the first strike of primary electrons 21 are herein referred to as first strike electrons. The first strike electrons are only those produced from the primary electrons strike. The first strike electrons 36 include both secondary electrons as well as possibly the primary electron. Subsequent strikes created from the produced secondary electrons further down each channel are secondary electron strikes but are not referenced as first strike electrons since first strike electrons are reserved only for those electrons produced by the first strike of primary electrons from the photocathode. The secondary electrons, either from the first strike electrons or from subsequently created secondary strike electrons, are biased down each channel 26 where even further tertiary, etc., strike electrons occur on the opposing arcuate surfaces surrounding an axial center of those channels to further increase the multiplying effect. While multiple strikes can occur from the input surface to the output surface of each channel and multiplied electrons with gain can result, the very first strike of only the primary electron 21 produces the first strike electrons 36. It is understood that each channel 26 produces first strike electrons 36 from the first strike of primary electrons 21 at a first strike angle FSA relative to the channel bias angle—the FSA being normal to the input face of the MCP 22. The first strike angle, while normal to the input face of MCP 22, is at an acute angle relative to CBA. Accordingly, CBA is preferably between 5 and 16 degrees, and more preferably between 5 and 8 degrees relative to normal of the MCP input surface.

The overall electron multiplication, amplification, and gain of MCP is in large part dependent on the mean number of electrons produced in response to an input event. Those electrons produced in response to an input event, or first strike electrons 36 produced in response to a primary electron 21 input event, will have significant impact on the overall performance of the MCP 22. As will be noted below, in reference to FIG. 4, one way to increase the production of first strike electrons 36 is to selectively apply contact metal in regions where the first strike electrons are typically not produced, and to increase the surface area where the first strike electrons are produced. MCP 22 now commercially available generally have a thickness of 20 mils or less. Channel 26 cross-sectional diameters are generally 3-8 microns.

Inconsistencies in either the pitch or diameter of the core leads to a percentage of channels that are larger than others, and unduly large electron emission points can form in those enlarged channels. The electron emission intensity values will therefore increase where there are more opportunities for first strike electrons to be formed in the channel with the larger diameters. The greater intensity, however, is localized in a very small number of pixels read by the phosphor covered optical fibers. Another cause for increased, localized intensity whenever channel diameters are inconsistent leads to a greater opportunity for first strike electrons impacting the input side contact metal 30 to reflect or bounce from the contact metal and into larger channels or channels caused by etch through of a neighboring channel. The uneven and periodically sharp electron emission points form from uneven channel diameters or channels enlarged due to neighboring channels merged together via cladding etch through. One technique in which to increase OAR, SNR and MTF of the MCP 22 is to shape the channel openings 26 into a funnel or tapered opening.

Differences in first strike angle (FSA) can depend on whether the channel opening is funnel shaped (tapered) or not tapered. The first strike angle is relative to the channel biased angle, wherein the first strike angle is typically normal to the input face of the MCP, whereas the CBA is the angle along the central axis at which each parallel-spaced channel extends. Because each channel is biased at CBA, CBA is also considered relative to normal of the input face. An increased number of first strike electrons results from an increased number of primary electrons that strike the showered side of the channel given the side of the channel opening is tapered rather than non-tapered. By tapering the showered side of the channel more towards normal, a greater number of first strike electrons can be produced thereby increasing the efficiency of the MCP. While increasing the surface area of the showered side surface increases the performance of the MCP, placement of contact metal on that surface can have deleterious effects. Accordingly, it is beneficial to combine a funnel shaped channel opening with selectively placed contact metal not on the showered surface but instead on a shaded surface of the channel opening as shown in FIG. 4.

Figure 4:
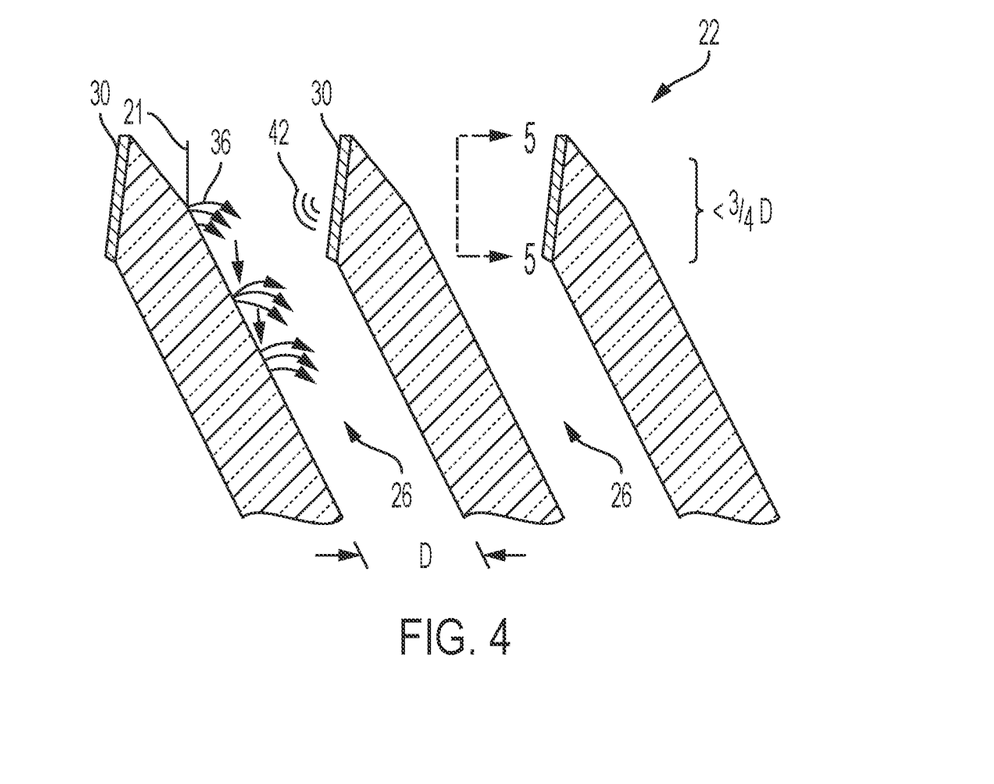
FIG. 4 is a partial cross sectional view of contact metal advantageously formed only on the shaded first side of example funnel shaped channel openings radially opposite the showered second side of the funnel shaped channel openings that are void of any contact metal.

FIG. 4 illustrates formation of contact metal 30 on the input or electron receiving surface of MCP 22 and only on the shaded first side of the channel openings 26. A shaded side of the channel openings is not in a perpendicular line of sight relationship with funnel shaped openings of channels 26. In the area of initial electron impact (i.e. primary electron 21 impact), the inner surface of channel 26 has a high secondary electron emissivity coefficient that will purposefully not be coated with low electron emissivity conductive material of contact metal 30. Electron amplification of channels 26 begins immediately upon impact on the showered second side of channels 26 rather than being delayed until the second or third strike of secondary electrons occurs. If the primary electrons were to contact the metallization material on the showered side, the metal would absorb and not produce sufficient first strike electrons, and therefore would lessen amplification within channels 26. Contact metal is purposefully placed only on the shaded, or first side, of each channel 26. According to one example, contact metal 30 is purposefully placed on the channel opening, either tapered or not, a distance less than ¾ D along the side of the channel, that distance D being the channel diameter after the taper or funnel no longer exists—if the channel opening is tapered.

Forming contact metal 30 on the input face of the MCP but only on the shaded first side of that opening (tapered or not) allows sufficient production of electrostatic field 42 which, in essence, efficiently pushes or electrostatically biases first strike electrons 36 produced from the showered second side downward further into the channel 26. A carefully selected placement of the contact metal 30 into only the shaded first side therefore maximizes first strike efficiency, with a significant electrostatic field 42 production and more effective secondary electron strike production further down each channel.

Figure 5:
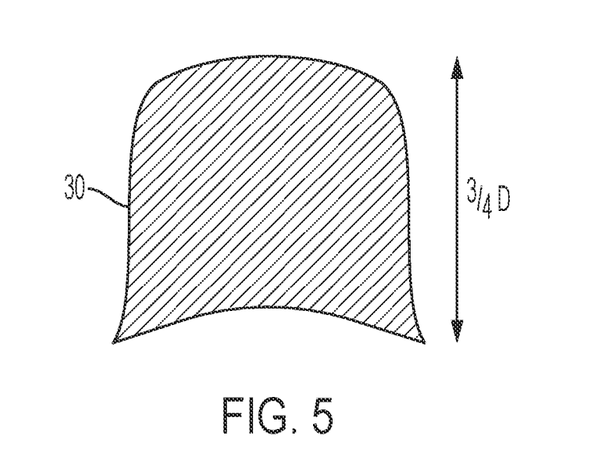
FIG. 5 is a front view of the contact metal and the depth and circumferential dimensions of the contact metal selectively and adjustably formed on the first side of a channel opening.

As noted in FIG. 5, the surface area along plane 5-5 of FIG. 4 illustrates contact metal on the first side of channel 26. The contact metal 30 on the shaded first side of channel extends from the input face of the MCP downward into each channel no more than ¾ D, as measured past the funnel opening, if the opening is funnel shaped.

Figure 6:
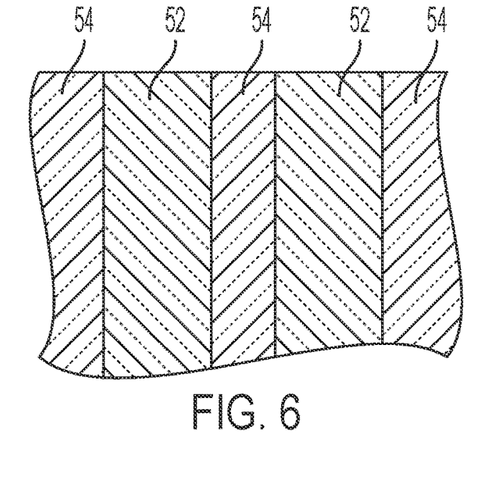
FIG. 6 is a partial cross sectional view of the glass core and cladding at an early fabrication of funnel shaped openings of MCP channels.
Figure 7:
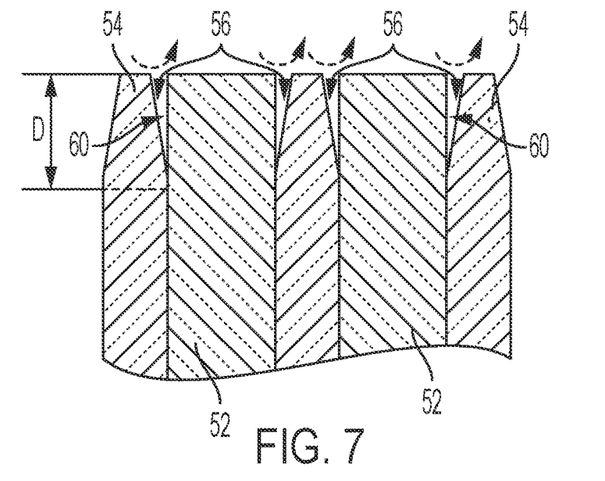
FIG. 7 is a partial cross sectional view of the segment of FIG. 6 after selective etching of the glass cladding at the core and cladding boundary.
Figure 8:
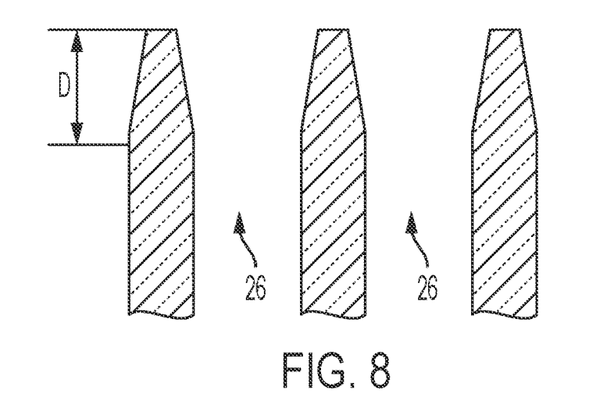
FIG. 8 is a partial cross sectional view of the segment of FIG. 7 after etching the glass core to entirely remove the core from the cladding.

Turning now to FIG. 6 through FIG. 8, a method is shown for producing an MCP. For sake and ease of illustration, the to-be-formed channels are not shown biased along a channel bias angle. However, it is understood that the channels would nonetheless be biased at the appropriate channel bias angle to maximize electron amplification and gain. FIG. 6 illustrates a plurality of glass cores surrounded by respective glass cladding arranged at a first angle relative to opposing surfaces of the ensuing MCP. For brevity in the drawing, only two glass cores 52 are shown, each surrounded by its own glass cladding 54. Core 52 can be made of alkali-resistant, acid-soluble glass, whereas cladding 54 can be made from alkali-soluble, acid resistant glass.

Turning to FIG. 7, the alkali material of the etched composition can preferentially etch a portion of the cladding 54, and specifically at the core/clad interface to produce grooves into the input plate surface of the MCP input face. Each groove 60 can extend a distance D into that interface. It is recognized that the core/clad interface undergoes substantial mechanical stress when the glass fibers are formed, so that certain types of etched composition like sodium hydroxide can attack the exposed interface due to the high chemical and mechanical stress in that region. To produce a funnel shaped opening for each channel, the interface zone is exposed only at the input and output ends of the channel with the core 52 still in place. For simplicity in the drawings, only the input face of the channel openings are shown, and only for two channels.

Next, as shown in FIG. 8, the glass cores 52 are etched preferentially with an acid de-core process using, for example, an acid-based etch composition. After the cores 52 are removed, as shown in FIG. 8, hollow channels 26 openings extend entirely through the MCP from the input face to the output face, with at least the input face having funnel shaped openings for each channel 26. The funnel shaped openings therefore have tapered sidewall surfaces extending a distance D into each channel, where D is substantially the same as the diameter of the channel 26 measured at a point further into the channel from the funnel shaped opening.

Figure 9:
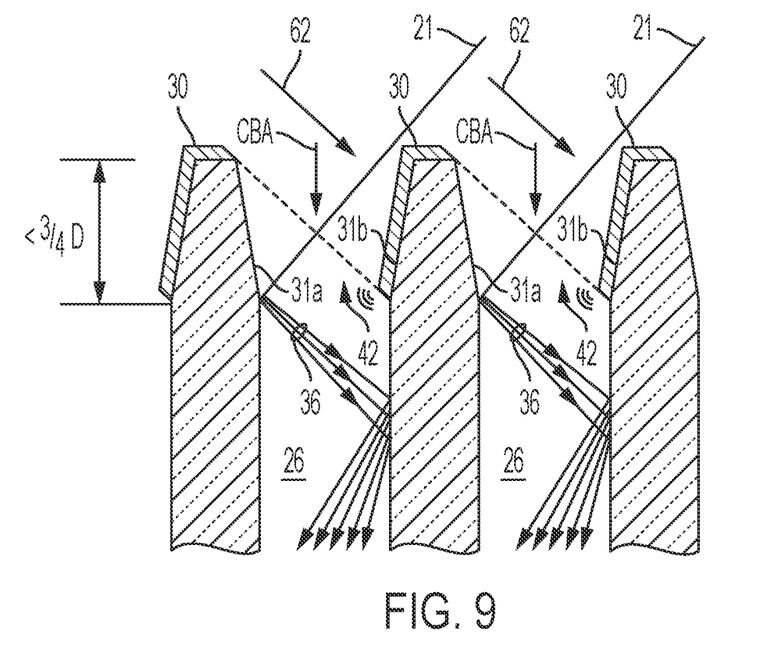
FIG. 9 is a partial cross sectional view of the segment of FIG. 8 after forming contact metal along the shaded first side of the funnel shaped openings.

Turning now to FIG. 9, the contact metal 30 is shown exclusively along the shaded first side of the plurality of spaced channel openings 26. According to one example, the channel openings 26 can be funnel shaped as shown in FIG. 9. Contact metal 30 is formed on each of the first sides of the channel openings down along the sides of the openings and into the openings between no more than ¾ D. It is appreciated that although FIG. 9 illustrates channels in a vertical orientation for simplicity in the drawings, channels 26 are nonetheless biased at a CBA. The primary electrons 21 strike only the second, or showered side 31a of the channel openings. Primary electrons 21 strike along that showered side 31a that extends from the opening a first distance into the channel. If the channel openings are funneled, the first distance can correspond the portion of the funnel shape that is tapered. Primary electrons 21 strike the second side 31a of each opening exclusively on, for example, the taper of that opening, and specifically radially opposite the first side on which contact metal 30 is formed. Accordingly, first strike electrons 36 are beneficially derived in the most efficient geometric position of the opening at a tapered angle closer to normal of the microchannel plate input surface facing the photocathode.

An evaporation window appears so that the contact metal deposition can take place along a line of sight 62 between an evaporation source and the exposed first side 31b on which contact metal 30 is deposited. The contact metal 30 is deposited using a planetary deposition system and method described further in reference to FIGS. 10-15.

Figures 10, 11A, 11B, 11C:
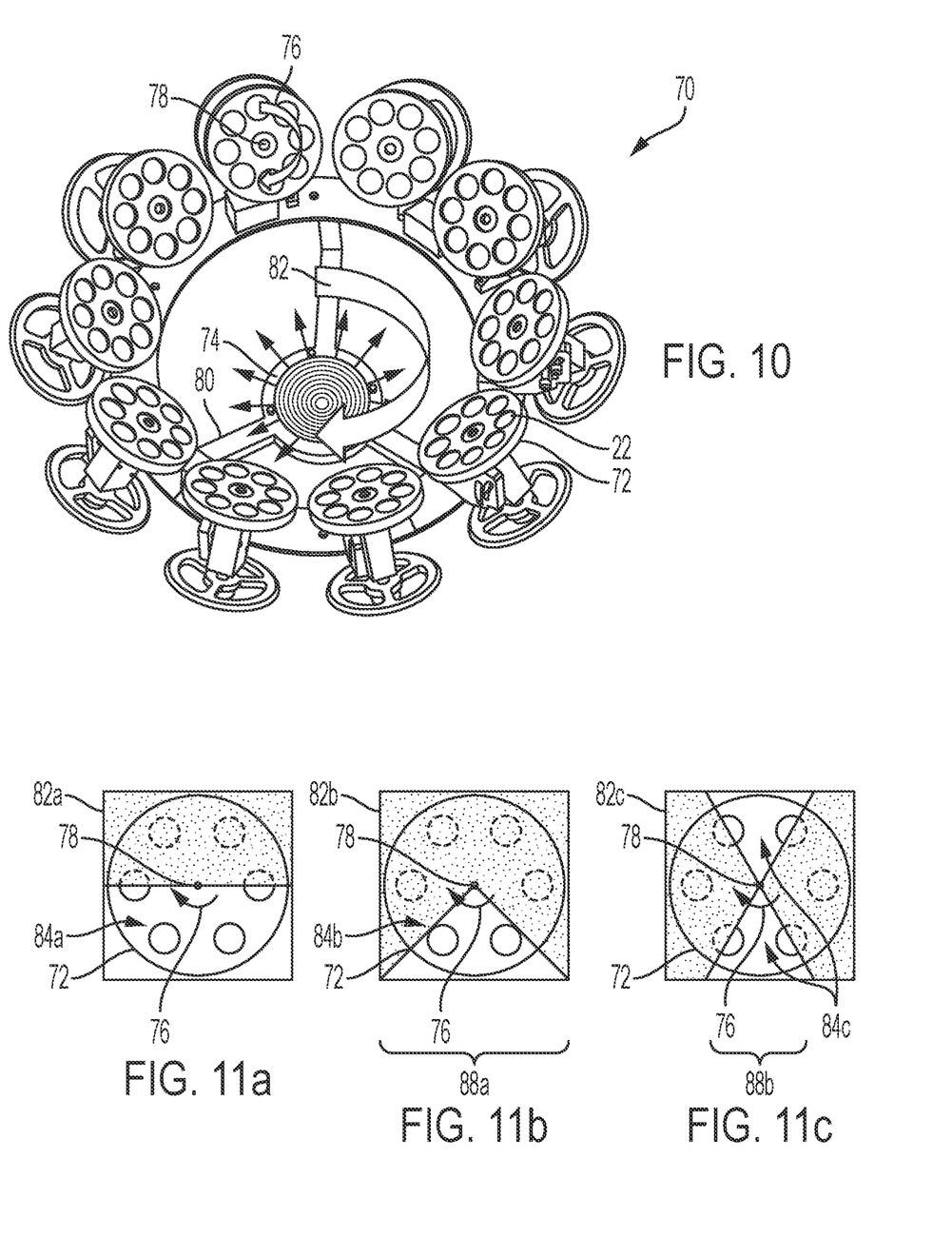
FIG. 10 is a top side view of a planetary deposition system for selectively depositing contact metal on the input face of MCPs mounted on multiple platters surrounding an evaporative source of contact metal, and specifically a deposition system for selectively depositing contact metal on the shaded first side of channel openings.
FIGS. 11a, 11b and 11c are top views of an adjustable mask opening, and in particular a semi-circular shaped mask opening, a wedge shaped mask opening and opposing wedge shaped mask opening, respectively.

Turning now to FIG. 10, a top side view of a planetary deposition system 70 is shown. Deposition system 70 utilizes a series of platters 72 surrounding an e-beam evaporation source 74. The evaporation source 74 (or other line of sight thin film deposition source) evaporates a source material such as Inconel or Nichrome of contact metal in a vacuum and directs the vapor particles of contact metal to a target object, which is a plurality of MCPs 22 mounted on a face of each platter 72. Upon contact with the MCP 22, the sourced contact metal then condenses back to a solid state. The MCPs 22 are mounted onto a corresponding platter 72, and each platter 72 is configured to rotate 76 about its central axis 78. Each platter 72 is configured to rotate about its platter central axis 76 while mounted onto a ring fixture 80. The ring fixture 80 rotates 82 about its central axis, preferably where the evaporative source 74 resides. The deposition system 70, comprising a rotating platter 72 that rotates around its central axis 78 that further rotates around the evaporative source 74 placed at the axial center of the ring fixture 80. The evaporative source 74, which arranged at the axial center of the ring fixture 80 can be along the central axis of the fixture 80 upward or downward from the ring fixture plane. The planetary deposition system 70 therefore comprises a system for depositing contact metal on MCP 22 both uniformly as well as selectively on the MCP input face, and partially into each channel opening at the input face. For sake of brevity and clarity in the drawing, FIG. 10 does not show a mask configured between the evaporative source 74 and each platter 72. However, FIG. 11 illustrates such as mask.

FIG. 11*a* is a top view of a platter 72 partially covered with a mask 82*a*. Mask 82*a* comprises any material that blocks evaporation or deposition of a source material upon a target material. Mask 82*a* can be any shape provided it covers platter 72, except only where there is an opening 84*a* in mask 82*a*. Mask 82*a* is arranged between the evaporative source 74 and the platter 72, and opening 84*a* is stationary whereas platter 72 rotates 76 about its platter central axis 78. Preferably the mask 82*a* is arranged as close as possible to the platter 72 to maximize deposition placement control, and is preferably less than several inches in front of platter 72 to achieve this goal. The mask opening 84*a* is shown in FIG. 11*a* as a semi-circular shape. The semi-circular shape will correspondingly form contact metal 30 in a semi-circular, arcuate, circumferential distance on the shaded first side 31*b* of each channel opening as will be described further hereinbelow.

FIG. 11*b* is also a top view of a platter 72 partially covered with a mask 82*b*. The mask 82*b* includes an opening 84*b* that is wedge shaped. The wedge shape will corresponding form contact metal 30 in a less than semi-circular, arcuate, circumferential distance around on the shaded first side 31*b*. The circumferential distance around the first side 31*b* is dependent on the size of the wedge, and in particular, the length of the triangle side 88*a* of opening 84*b*. FIG. 11*c* illustrates a smaller wedge shaped opening 84*c* and a commensurate shorter length of the triangle side 88*b* of opening 84*c*. The mask 82*c* with opening 84*c* will therefore produce a lesser circumferential distance around the first side 31*b* then mask 82*b* with opening 84*b*, and certainly less than the circumferential distance around the first side 31*b* then mask 82*a* with semi-circular opening 84*a*. Also, as noted in FIG. 11*c*, there can be two openings 84*c* to illustrate that the contact metal can be deposited in a number of different ways, possibly other than on a shaded side and possibly twice per rotation of the platter 72 around its central axis 78.

Figure 12:
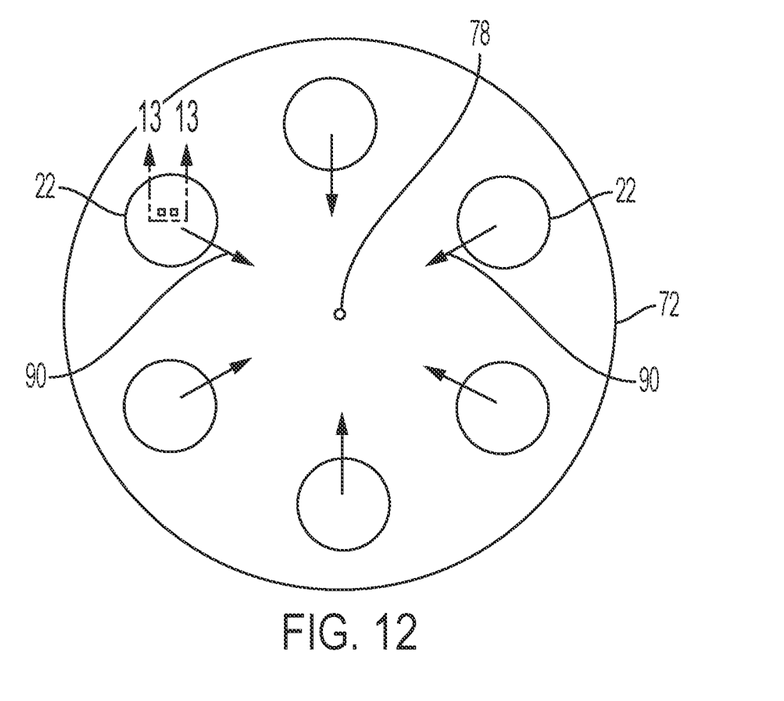
FIG. 12 is a top plan view of a plurality of MCPs mounted on a surface of a platter with their vector CBAs directed toward the platter central axis.

FIG. 12 is a top plan view of a plurality of MCPs 22 mounted on a surface of each platter 72. In part, to achieve deposition on only the shaded first side 31*b*, the CBA and specifically the vector of the CBA for each channel must be directed (or biased) 90 toward the platter central axis 78. Since the core and cladding of each channel that forms the MCP 22 is produced in unison, each with the same CBA vector extending in the same direction, the MCPs on each platter can be arranged so the CBA for each channel looking downward into each channel are positioned so that the CBAs of each channel for each MCP mounted on platter 72 are directed as shown by arrow 90.

Figure 13:
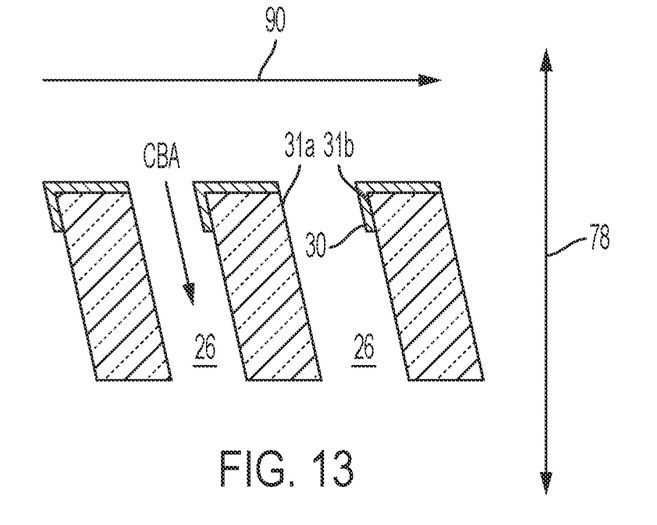
FIG. 13 is a partial cross-sectional of a MCP along portion 13-13 of FIG. 12 showing the CBA of each of the channels directed toward the platter central axis.

FIG. 13 is a partial cross-sectional view of a MCP along portion 13-13 of FIG. 12 showing the CBA of each of the channels 26 directed toward the platter central axis 78. In particular the channel openings of each MCP is arranged on the platter 72 so they are biased at a CBA. The CBA extends from the channel openings along respective channel central axes and toward the platter central axis 78 to receive, upon activation of the evaporative source 74, contact metal 30 through the mask opening 84*a*, 84*b* or 84*c* and onto only the shaded first side 31*b* and not the showered second side 31*a*. For sake of brevity and clarity, FIG. 13 only shows two channels 26 and the corresponding first and second sides 31*b* and 31*a*, respectively, of those channel openings. It is understood that each MCP contains upwards of a thousand or more channels, however.

Figure 14:
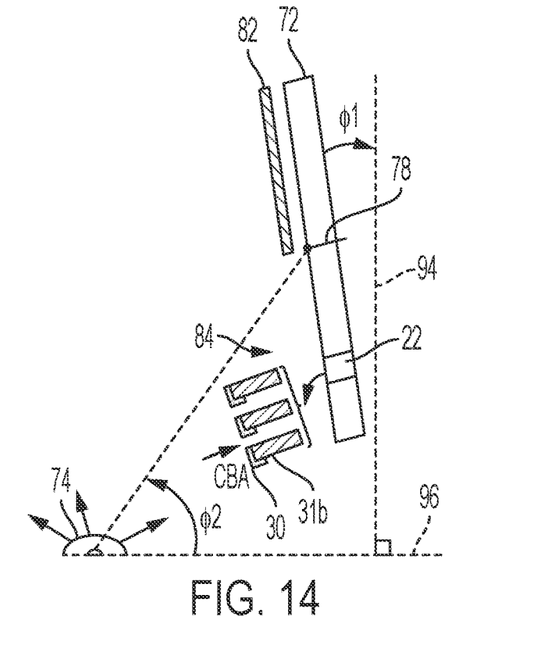
FIG. 14 is a side view of the planetary deposition system showing the mask with its opening arranged between the tilted, rotating and orbiting MCP-mounted platter resulting in contact metal on the oblique or shaded first side channel openings that face, or are in the line of sight of, the evaporative source.

FIG. 14 is a partial side plan view of the planetary deposition system 70 showing the mask 82 with its opening 84 arranged between the tilted, rotating and orbiting MCP-mounted platter 72, resulting in contact metal 30 deposited on the oblique or shaded first side 31*b* of channel openings that face, and are in the line of sight of, the evaporative source 74. Keeping in mind that as the platter 72 rotates, the position of the mask opening 84 changes relative to the MCP channels, and the channel openings in particular. By varying the amount or angular degree of the mask opening 84, the circumferential distance around the channel opening at which the contact metal 30 is deposited on the first side 31*b* will vary commensurate thereto. FIG. 14 illustrates a further variance in the depth at which the contact metal can be deposited into each channel opening. For example, changing the tilt first angle $\varphi 1$ relative to a first axis 94 can vary the depth of deposition. Decreasing first angle $\varphi 1$ can increase the depth of deposition. Also, for example, changing the angle of rotation around the evaporative source 74 second angle $\varphi 2$ relative to second axis 96 can vary the depth of deposition. Decreasing second angle $\varphi 2$ can decrease the depth of deposition. The first and second axes 94, 96 can be perpendicular to each other. The first axis 94 can be a vertical axis and the second axis 96 can be a horizontal axis, for example. The tilt first angle $\varphi 1$ relative to a first axis 94 is preferably in the range of 0 to 15°, and the rotating or orbiting second angle $\varphi 2$ relative to the second axis 96 is preferably in the range of 65 to 80°.

Figure 15:
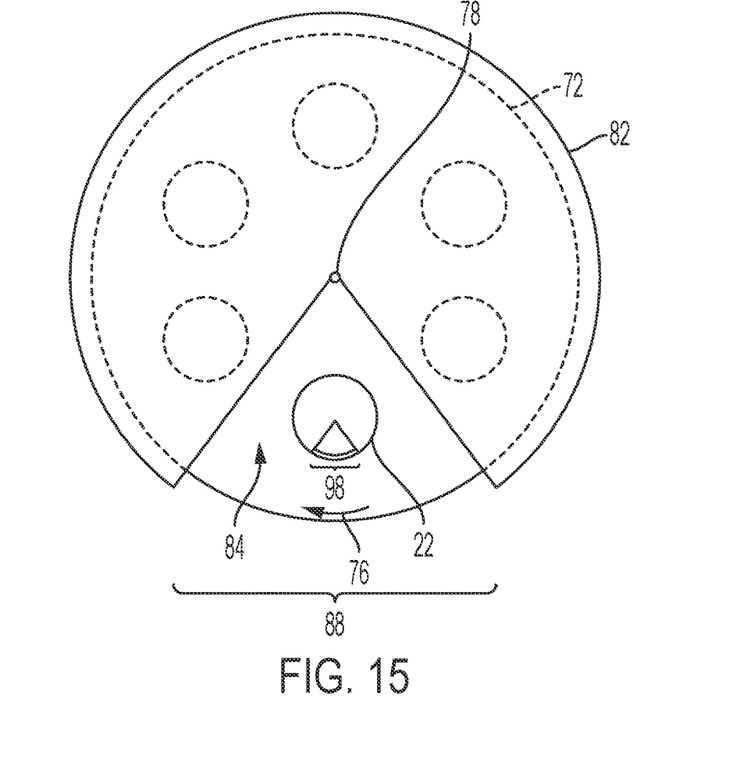
FIG. 15 is a top view as seen from the evaporative source with the MCP-mounted platter rotating beneath a mask opening to expose to the evaporative source only the shaded first side of each of the plurality of channel openings depending on the adjustable size of the mask opening and the adjustable tilt and orbital angles.

FIG. 15 is a top plan view as seen from the evaporative source 74. The MCP-mounted platter 72 is shown in phantom rotating behind a mask 82, and more particularly an opening 84 within mask 82. The amount of opening 84 can be adjusted to commensurately change the circumferential distance 98 along the first side 31*b* exposed to the evaporative source 74. Using planetary motion with both the ring fixture and the platter rotating, allows for a more uniform deposition of contact metal 30 on only the first side 31*b*. Also, importantly, using a mask 82 that is fixed to and rotates with the ring fixture and remains in front of the platter, but does not rotate with the platter about its own axis or the platter central axis, selectively places the contact metal circumferentially around the first side 31*b*. The MCP electrode is therefore deposited on the first side channel wall as dictated by the mask design and opening configuration. The mask opening provides fully configurable circumferential coverage and location of the contact metal into the channel opening, provides deposition uniformity as each MCP is exposed to the same deposition and provides improved electrode contact metal conductivity as compared to any non-rotation methodology. The planetary deposition system and method therefore combines the high yield afforded by rotation contact metal deposition via an adjustable mask with an increased MCP SNR performance.

It is important to note that the construction and arrangement of the various example embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Additionally, features from particular embodiments may be combined with features from other embodiments as would be understood by one of ordinary skill in the art. Other substitutions, modifications, changes and omissions may also be made in the design, operating conditions and arrangement of the various example embodiments without departing from the scope of the present invention.

As used herein, the terms "about," "approximately," "substantially," "generally," and the like mean plus or minus 10% of the stated value or range. In addition, as used herein, the singular forms "a," "an" and "the" are intended to include the plural forms as well, unless the context clearly indicates otherwise. The term "and/or" includes any and all combinations of one or more of the associated listed items. For example, reference to "a feature" includes a plurality of such "features." The term "and/or" used in the context of "X and/or Y" should be interpreted as "X," or "Y," or "X and Y".

The illustrated embodiments described in the detailed description, drawings, and claims are not meant to be limiting. Other embodiments may be used, and other changes may be made, without departing from the spirit or scope of the subject matter presented herein. Additionally, particular aspects of each embodiment may also be used in conjunction with other embodiments of the present disclosure and thus, the disclosed embodiments may be combined as understood in the art. It will be readily understood that the aspects of the present disclosure, as generally described herein, and illustrated in the figures, can be arranged, substituted, combined, separated, and designed in a wide variety of different configurations, all of which are explicitly contemplated herein.

It should be noted that any use of the term "example" herein to describe various embodiments is intended to indicate that such embodiments are possible examples, representations, and/or illustrations of possible embodiments (and such term is not intended to connote that such embodiments are necessarily extraordinary or superlative examples). Further, as utilized herein, the term "substantially" and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed (e.g., within plus or minus five percent of a given angle or other value) are considered to be within the scope of the invention as recited in the appended claims. The term "approximately" when used with respect to values means plus or minus five percent of the associated value.

The terms "coupled" and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure as defined in the appended claims.

Without further elaboration, it is believed that one skilled in the art can use the preceding description to utilize the claimed inventions to their fullest extent. The examples and embodiments disclosed herein are to be construed as merely illustrative and not a limitation of the scope of the present disclosure in any way. It will be apparent to those having skill in the art that changes may be made to the details of the above-described embodiments without departing from the underlying principles discussed. In other words, various modifications and improvements of the embodiments specifically disclosed in the description above are within the scope of the appended claims. For example, any suitable combination of features of the various embodiments described is contemplated.

What is claimed is:

1. A night vision system, comprising:
    an image intensifier tube placed between a lens and an eyepiece, wherein the image intensifier tube comprises:
        a photocathode;
        a phosphor covered anode; and
        a microchannel plate arranged a spaced distance between the photocathode and the phosphor covered anode;
            wherein the microchannel plate comprises a spaced plurality of channel openings with circular cross sections extending from an input side of the microchannel plate facing the photocathode through to an output side of the microchannel plate;

wherein the channel openings are funnel shaped channel openings;

wherein the channel openings have a have a channel bias angle taken along the central axis of the channel openings;

wherein the microchannel plate has an un-shaded side corresponding with an inner surface of the channel openings that is visible from a line of sight perpendicular to the normal of the input side;

wherein the microchannel plate has a shaded side corresponding with an inner surface of the channel openings that is not visible from a line of sight perpendicular to the normal of the input side; and wherein a first side of the shaded side includes contact metal to draw first strike electrons produced from a second side of the channel openings radially opposite the first side.

2. The night vision system of claim 1, wherein the contact metal is coupled to a voltage supply to generate an electric field to draw first strike electrons from each of the channel openings through each corresponding channel.

3. The night vision system of claim 1, wherein the funnel shaped channel openings decrease in diameter from the input side to a first distance away from the input side and towards the output side and have a constant diameter from the first distance to a second distance through the output side of the microchannel plate.

4. The night vision system of claim 1, wherein the channel bias angle is between 5 and 16 degrees relative to the normal to the microchannel plate surface facing the photocathode.

5. The night vision system of claim 1, wherein the photocathode is configured to produce primary electrons that strike primarily the second side of the channel openings and produce the first strike electrons solely from the second side.

6. The night vision system of claim 1, wherein the second side of each of the plurality of channel openings is substantially void of any contact metal.

7. The night vision system of claim 1, wherein the first side of each of the plurality of channel openings is less than one half a circumferential distance around each of the plurality of channel openings, and wherein the second side of each of the plurality of channel openings is less than one half a circumferential distance around each of the plurality of channel openings radially opposite the first side.

\* \* \* \* \*